United States Patent
Park et al.

(10) Patent No.: US 11,804,838 B2
(45) Date of Patent: Oct. 31, 2023

(54) TRANSMITTER CIRCUIT INCLUDING SELECTION CIRCUIT, AND METHOD OF OPERATING THE SELECTION CIRCUIT

(71) Applicant: Samsung Electronics Co., Ltd., Suwon-si (KR)

(72) Inventors: Junyoung Park, Seongnam-si (KR); Joohwan Kim, Seoul (KR); Jindo Byun, Suwon-si (KR); Eunseok Shin, Seoul (KR); Hyunyoon Cho, Uiwang-si (KR); Youngdon Choi, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/751,148

(22) Filed: May 23, 2022

(65) Prior Publication Data

US 2022/0385287 A1    Dec. 1, 2022

(30) Foreign Application Priority Data

May 27, 2021    (KR) .................... 10-2021-0068611
Sep. 9, 2021     (KR) .................... 10-2021-0120542

(51) Int. Cl.
*H03K 17/693*    (2006.01)
*H03K 19/20*     (2006.01)
(Continued)

(52) U.S. Cl.
CPC ........... *H03K 17/693* (2013.01); *H03K 19/20* (2013.01); *G11C 11/4076* (2013.01); *G11C 11/4093* (2013.01); *H03M 9/00* (2013.01)

(58) Field of Classification Search
CPC ................................................. H03K 17/693
(Continued)

(56) References Cited

U.S. PATENT DOCUMENTS

| 5,045,714 A | 9/1991 | Park et al. |
| 7,443,219 B2 | 10/2008 | Rausch |

(Continued)

FOREIGN PATENT DOCUMENTS

| KR | 1020000050960 A | 8/2000 |
| TW | 201628341 A | 8/2016 |

OTHER PUBLICATIONS

Extended European Search Report dated Oct. 31, 2022 for corresponding EP Patent Application No. 22173700.0.

(Continued)

*Primary Examiner* — Tomi Skibinski
(74) *Attorney, Agent, or Firm* — Muir Patent Law, PLLC

(57) ABSTRACT

A transmitter circuit includes a clock generator configured to generate a plurality of clock signals having different phases, and a plurality of selection circuits configured to receive a plurality of parallel data signals and output a serial data signal on an output node based on the plurality of clock signals and the received plurality of parallel data signals. Each of the plurality of selection circuits includes a data multiplexer configured to generate a plurality of data selection signals based on the received one of the plurality of parallel data signals and the plurality of clock signals; a control signal generator configured to generate first and second control signals based on the plurality of data selection signals; and an output driver connected to the output node, and configured to precharge the output node based on the first control signal or discharge the output node based on the second control signal.

20 Claims, 14 Drawing Sheets

(51) Int. Cl.
    *G11C 11/4076*     (2006.01)
    *G11C 11/4093*     (2006.01)
    *H03M 9/00*        (2006.01)

(58) Field of Classification Search
    USPC ......................................................... 327/108
    See application file for complete search history.

(56) References Cited

U.S. PATENT DOCUMENTS

| | | |
|---|---|---|
| 8,203,900 B2 | 6/2012 | Lee |
| 8,773,421 B2 | 7/2014 | Ando et al. |
| 9,310,830 B2 | 4/2016 | Fiedler |
| 9,432,061 B2 | 8/2016 | Fiedler |
| 9,525,573 B2 | 12/2016 | Fiedler |
| 10,367,506 B1 | 7/2019 | Chatwin |
| 10,560,097 B1 | 2/2020 | Peng et al. |
| 11,003,203 B2 | 5/2021 | Poon et al. |
| 2013/0007500 A1* | 1/2013 | Fiedler ..................... G06F 1/10 713/501 |

OTHER PUBLICATIONS

First Office Action dated Jun. 13, 2023 for corresponding TW Patent Application No. 111119485.

* cited by examiner

TRANSMITTER CIRCUIT INCLUDING SELECTION CIRCUIT, AND METHOD OF OPERATING THE SELECTION CIRCUIT

CROSS-REFERENCE TO RELATED APPLICATIONS

This application is based on and claims priority under 35 U.S.C. § 119 to Korean Patent Application Nos. 10-2021-0068611, filed on May 27, 2021, and 10-2021-0120542, filed on Sep. 9, 2021, in the Korean Intellectual Property Office, the disclosure of each of which is incorporated by reference herein in its entirety.

BACKGROUND

The technical idea of the inventive concept relates to a transmitter circuit including a selection circuit, and more particularly, to the selection circuit for performing a low-power operation, and an operation method of the selection circuit.

The transmitter circuit may include a serializer that generates a serial data signal by sequentially outputting a plurality of parallel data signals. The serializer may sequentially output a plurality of parallel data signals based on a plurality of clock signals having different phases. As the plurality of clock signals are toggled, a plurality of transistors included in the transmitter circuit may be switched at high speed, and as the number of switched transistors increases, power consumed by the transmitter circuit may increase.

SUMMARY

The technical idea of the inventive concept relates to a transmitter circuit, and provides a selection circuit that performs a low-power serializing operation using only partially toggled data selection signals, a method of operating the selection circuit, and a transmitter circuit including the selection circuit.

According to example embodiments, a transmitter circuit may include a clock generator configured to generate a plurality of clock signals having different phases from each other based on a reference clock signal, and a plurality of selection circuits connected to an output node. The plurality of selection circuits are configured to receive a plurality of parallel data signals, and output a serial data signal on the output node based on the plurality of clock signals and the received plurality of parallel data signals. Each of the plurality of selection circuits includes a data multiplexer configured to generate a plurality of data selection signals based on a logic operation between the received one of the plurality of parallel data signals and the plurality of clock signals; a control signal generator configured to generate first and second control signals based on a logic operation between the plurality of data selection signals; and an output driver connected to the output node, and configured to precharge the output node based on the first control signal or discharge the output node based on the second control signal.

According to example embodiments, a selection circuit may include a data multiplexer configured to generate a plurality of data selection signals based on a logic operation between a received data signal and a plurality of clock signals; a control signal generator configured to generate first and second control signals based on a logic operation between the plurality of data selection signals; and an output driver connected to an output node, and configured to drive the output node by precharging the output node based on the first control signal or discharging the output node based on the second control signal. While a logic level of the received data signal is maintained at a specific logic level, a logic level of some of the plurality of data selection signals is transitioned and a logic level of the other data selection signals is maintained constant.

According to example embodiments, a method of operating a selection circuit may include generating a plurality of data selection signals based on a logic operation between the received data signal and a plurality of clock signals; generating first and second control signals based on a logic operation between the plurality of data signals; and driving the output node by precharging the output node based on the first control signal or discharging the output node based on the second control signal. While a logic level of the received parallel data signal is maintained at a specific logic level, the generating of the plurality of data selection signals includes transitioning logic levels of some of the plurality of data selection signals; and maintaining logic levels of the other data selection signals constant.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, various embodiments of the inventive concept are described with reference to the accompanying drawings.

Figure 1:
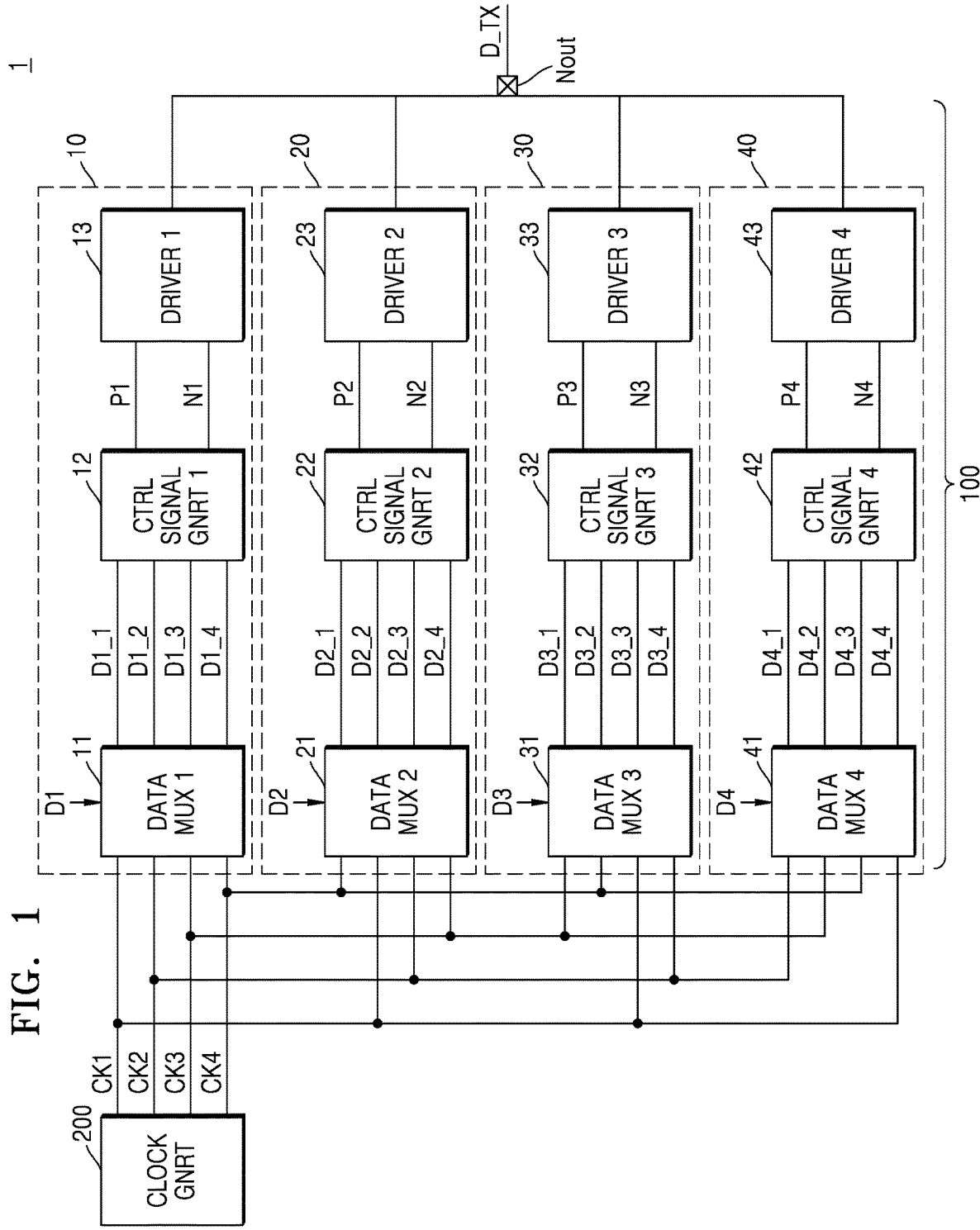
FIG. 1 is a diagram for explaining a transmitter circuit according to an example embodiment of the inventive concept.
Figure 2:
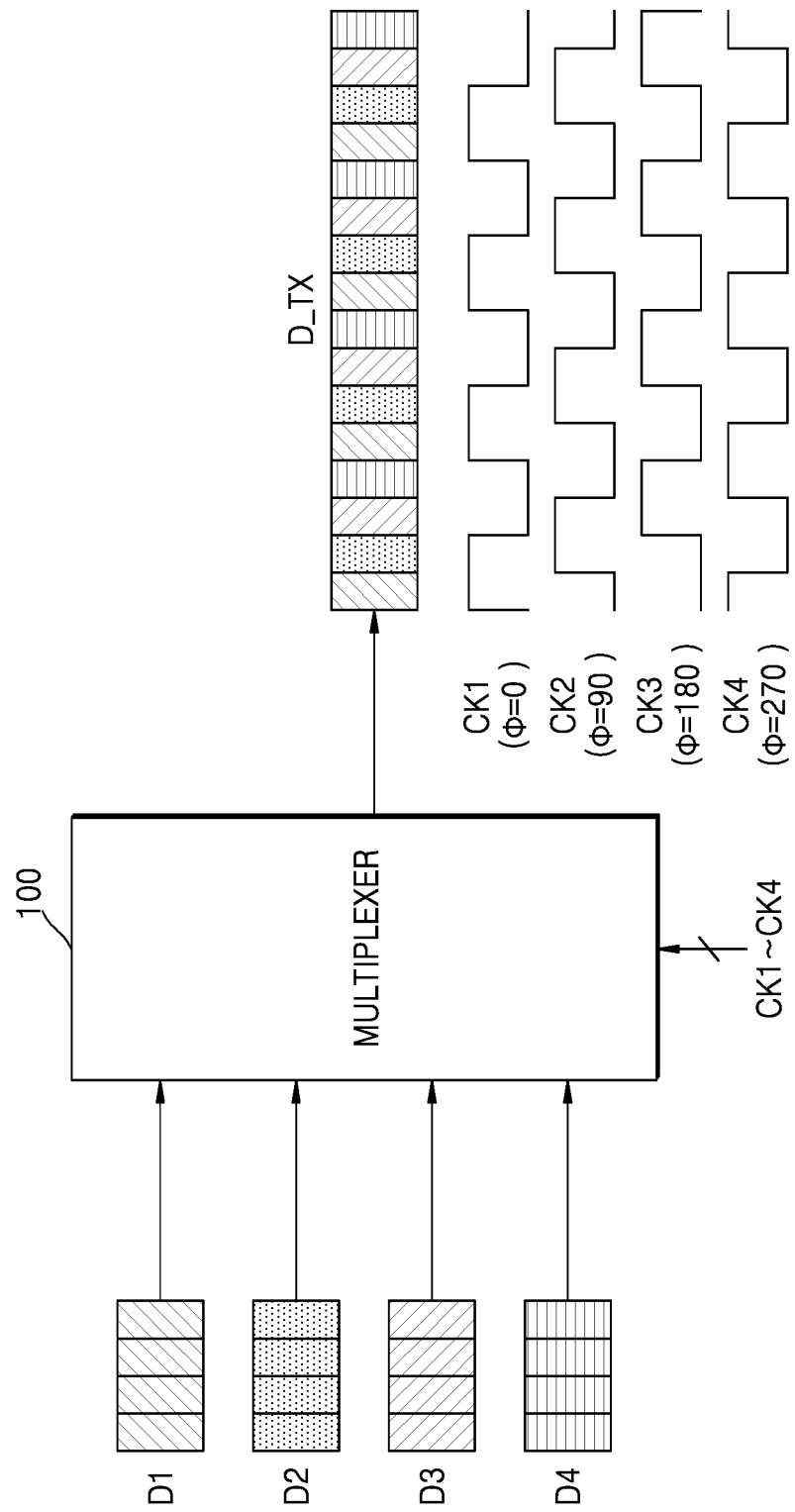
FIG. 2 is a diagram for explaining a serializing operation according to an example embodiment of the inventive concept.

FIG. 1 is a diagram for describing a transmitter circuit according to an example embodiment of the inventive concept. FIG. 2 is a diagram for explaining a serializing operation according to an example embodiment of the inventive concept.

Referring to FIG. 1, a transmitter circuit 1 may receive first to fourth parallel data signals D1 to D4 in parallel and output a serial data signal D_TX. Each of the first to fourth parallel data signals D1 to D4 may be transmitted to a multiplexer 100 through different channels, and the serial data signal D_TX may be externally output through one channel. Although it is shown that four parallel data signals are received, the embodiment is not limited thereto, and N (N is an integer greater than or equal to 2) parallel data signals may be received. For example, the transmitter circuit 1 may receive the first to fourth parallel data signals D1 to D4 from a memory cell array of a semiconductor memory device (e.g., 1300 of FIG. 10).

The transmitter circuit 1 may include the multiplexer 100 and a clock generator 200.

The multiplexer 100 may sequentially output the first to fourth parallel data signals D1 to D4 in response to first to fourth clock signals CK1 to CK4. In detail, referring to FIG. 2, the multiplexer 100 may output the first parallel data signal D1 in response to an active edge (e.g., a rising edge) of the first clock signal CK1, may output the second parallel data signal D2 in response to an active edge of the second clock signal CK2, may output a third parallel data signal D3 in response to an active edge of the third clock signal CK3, and may output the fourth parallel data signal D4 in response to the active edge of the fourth clock signal CK4. For example, the multiplexer 100 may perform a serializing operation for converting the first to fourth parallel data signals D1 to D4 into one serial data signal D_TX. However, the embodiment is not limited thereto, and the multiplexer 100 may convert N parallel data signals into one serial data signal D_TX.

The multiplexer 100 may include first, second, third and fourth selection circuits 10, 20, 30 and 40. Each of the first, second, third and fourth selection circuits 10, 20, 30 and 40 may receive the first to fourth clock signals CK1 to CK4 and output a corresponding parallel data signal. For example, the first selection circuit 10 may output the first parallel data signal D1 in response to an active edge of the first clock signal CK1. The second selection circuit 20 may output the second parallel data signal D2 in response to the active edge of the second clock signal CK2. The third selection circuit 30 may output the third parallel data signal D3 in response to the active edge of the third clock signal CK3. The fourth selection circuit 40 may output the fourth parallel data signal D4 in response to the active edge of the fourth clock signal CK4.

For convenience of explanation, four clock signals are illustrated, but the embodiment is not limited thereto, and the multiplexer 100 may generate the serial data signal D_TX by performing a serializing operation on N parallel data signals based on the N clock signals.

In detail, the first selection circuit 10 may include a first data multiplexer 11, a first control signal generator 12, and a first output driver 13.

The first data multiplexer 11 may generate first to fourth data selection signals D1_1 to D1_4 based on a logic operation between the first parallel data signal D1 and the first to fourth clock signals CK1 to CK4. While the first parallel data signal D1 is maintained at a specific logic level (e.g., a logic low level or a logic high level), the logic level of some of the first to fourth data selection signals D1_1 to D1_4 may be maintained and the logic level of the other data selection signals may be transitioned, by a logic operation between the first parallel data signal D1 and the first to fourth clock signals CK1 to CK4. For example, because only some of the first to fourth data selection signals D1_1 to D1_4 are toggled during the serializing operation, power consumed by the first selection circuit 10 may be reduced.

The first control signal generator 12 may generate first and second control signals P1 and N1 based on a logic operation between the first to fourth data selection signals D1_1 to D1_4. When the first parallel data signal D1 has a logic high level, the first control signal generator 12 may perform a logic operation based on the first to fourth data selection signals D1_1 to D1_4 so that the first control signal P1 has a logic low level. When the first parallel data signal D1 has a logic low level, the first control signal generator 12 may perform a logic operation based on the first to fourth data selection signals D1_1 to D1_4 so that the second control signal N1 has a logic high level.

The first output driver 13 may drive the output node Nout based on the first control signal P1 and the second control signal N1. For example, the first output driver 13 may precharge the output node Nout when the first control signal P1 is at a logic low level, and the output node Nout may be discharged when the second control signal N1 has a logic high level.

The second selection circuit 20 may include a second data multiplexer 21, a second control signal generator 22, and a second output driver 23. The second data multiplexer 21 may generate first to fourth data selection signals D2_1 to D2_4. The second control signal generator 22 may generate first and second control signals P2 and N2. The third selection circuit 30 may include a third data multiplexer 31, a third control signal generator 32, and a third output driver 33. The third data multiplexer 31 may generate first to fourth data selection signals D3_1 to D3_4. The third control signal generator 32 may generate first and second control signals P3 and N3. The fourth selection circuit 40 may include a fourth data multiplexer 41, a fourth control signal generator 42, and a fourth output driver 43. The fourth data multiplexer 41 may generate first to fourth data selection signals D4_1 to D4_4. The fourth control signal generator 42 may generate first and second control signals P4 and N4. The description of the first selection circuit 10 may also be applied to the second, third and fourth selection circuits 20, 30 and 40.

For convenience of explanation, four selection circuits are illustrated, but the embodiment is not limited thereto. For example, the multiplexer 100 may include N selection circuits, and each of the N selection circuits may output a parallel data signal based on N clock signals. In detail, each of the N selection circuits may include a data multiplexer, a control signal generating circuit, and an output driver. The data multiplexer may generate N data selection signals based on the N clock signals. The data multiplexer may constantly maintain the logic level of at least one data selection signal among the N data selection signals while the logic level of the parallel data signal is maintained at a specific logic level (e.g., a logic low level or a logic high level). For example, while the logic level of the parallel data signal is maintained at a specific logic level (e.g., a logic low level or a logic high level), the logic level of at least one data selection signal among the N data selection signals may not be toggled. The control signal generator may generate a control signal for controlling the output driver based on the N data signals. For example, a transistor that receives a non-toggle data selection signal among transistors constituting the control signal generator may not operate. Accordingly, power consumed by the selection circuit may be reduced. The logic levels of the data selection signals may be described below in detail with reference to FIGS. 5A, 5B, 5C, 8A, 8B, and 8C.

The clock generator 200 may generate first to fourth clock signals CK1 to CK4. A duty ratio of the first to fourth clock signals CK1 to CK4 may be 50%. The duty ratio may represent a ratio of a time period for which the active signal is applied in one cycle. The first to fourth clock signals CK1 to CK4 may have different phases. For example, referring to FIG. 2, the phase of the first clock signal CK1 is 0°, the phase of the second clock signal CK2 is 90°, the phase of the third clock signal CK3 is 180°, and the phase of the fourth clock signal CK4 is 270°. However, the embodiment is not limited thereto, and the clock generator 200 may generate N clock signals having a mutually constant phase difference.

According to the transmitter circuit 1 according to an example embodiment of the inventive concept, when the serializing operation is performed, some of the first to fourth data selection signals D1_1 to D1_4 are not toggled and maintain a logic level, so power consumed by the first to fourth data selection signals D1_1 to D1_4 may be reduced. Accordingly, the transmitter circuit 1 may perform a serializing operation with low power.

Figure 3A:
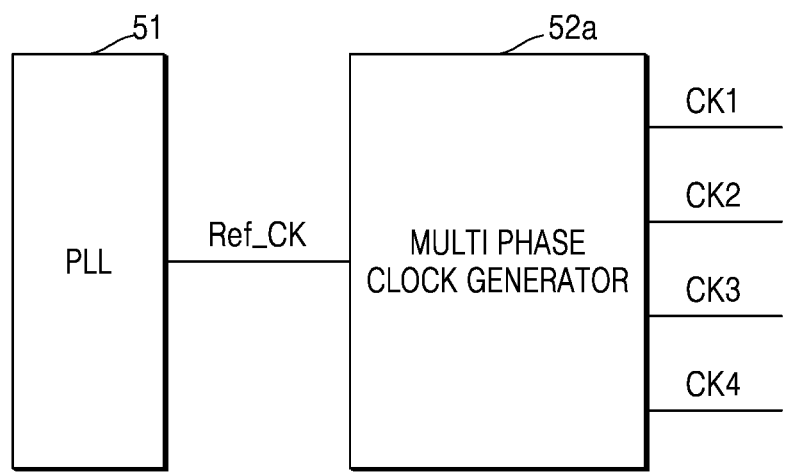
FIGS. 3A and 3B are diagrams for explaining a clock generator according to an example embodiment of the inventive concept.
Figure 3B:
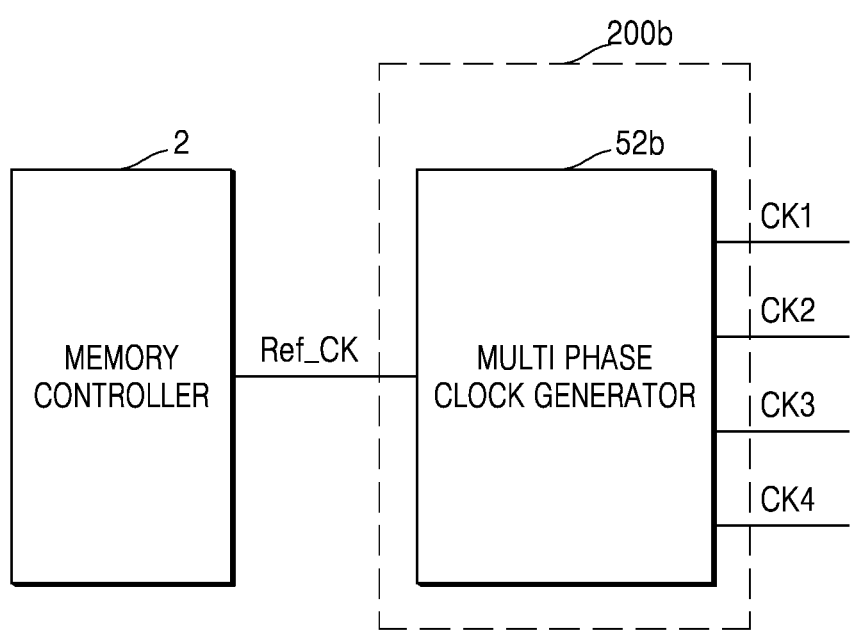

FIGS. 3A and 3B are diagrams for explaining a clock generator according to an example embodiment of the inventive concept.

Referring to FIG. 3A, a clock generator 200a may include a phase locked loop (PLL) 51 and a multi-phase clock generator 52a. The clock generator 200a may be an example of the clock generator 200 of FIG. 1.

The PLL 51 may generate a reference clock signal Ref_CK and transmit the reference clock signal Ref_CK to the multi-phase clock generator 52a. The PLL 51 may include an oscillator. The duty ratio of the reference clock signal Ref_CK may be 50%.

The multi-phase clock generator 52a may generate first to fourth clock signals CK1 to CK4 having different phases from each other based on the reference clock signal Ref_CK. For example, the phase of the first clock signal CK1 may be 0°, the phase of the second clock signal CK2 may be 90°, the phase of the third clock signal CK3 may be 180°, and the phase of the fourth clock signal CK4 may be 270°. The multi-phase clock generator 52a may include a delay locked loop (DLL).

Referring to FIG. 3B, a clock generator 200b may receive a reference clock signal Ref_CK from a memory controller 2 and first to fourth clock signals CK1 to CK4 may be generated based on the reference clock signal Ref_CK. The clock generator 200b may be an example of the clock generator 200 of FIG. 1.

In some embodiments, the clock generator 200b may be included in a semiconductor memory device (e.g., 1300 of FIG. 10), and the memory controller 2 may transmit the reference clock signal Ref_CK to the semiconductor memory device 1300. In some embodiments, the reference clock signal Ref_CK may be referred to as a write clock signal WCK. The semiconductor memory device 1300 may generate a serial data signal by performing a serializing operation based on a write clock signal WCK, and may transmit the generated serial data signal to the memory controller 2.

Figure 4:
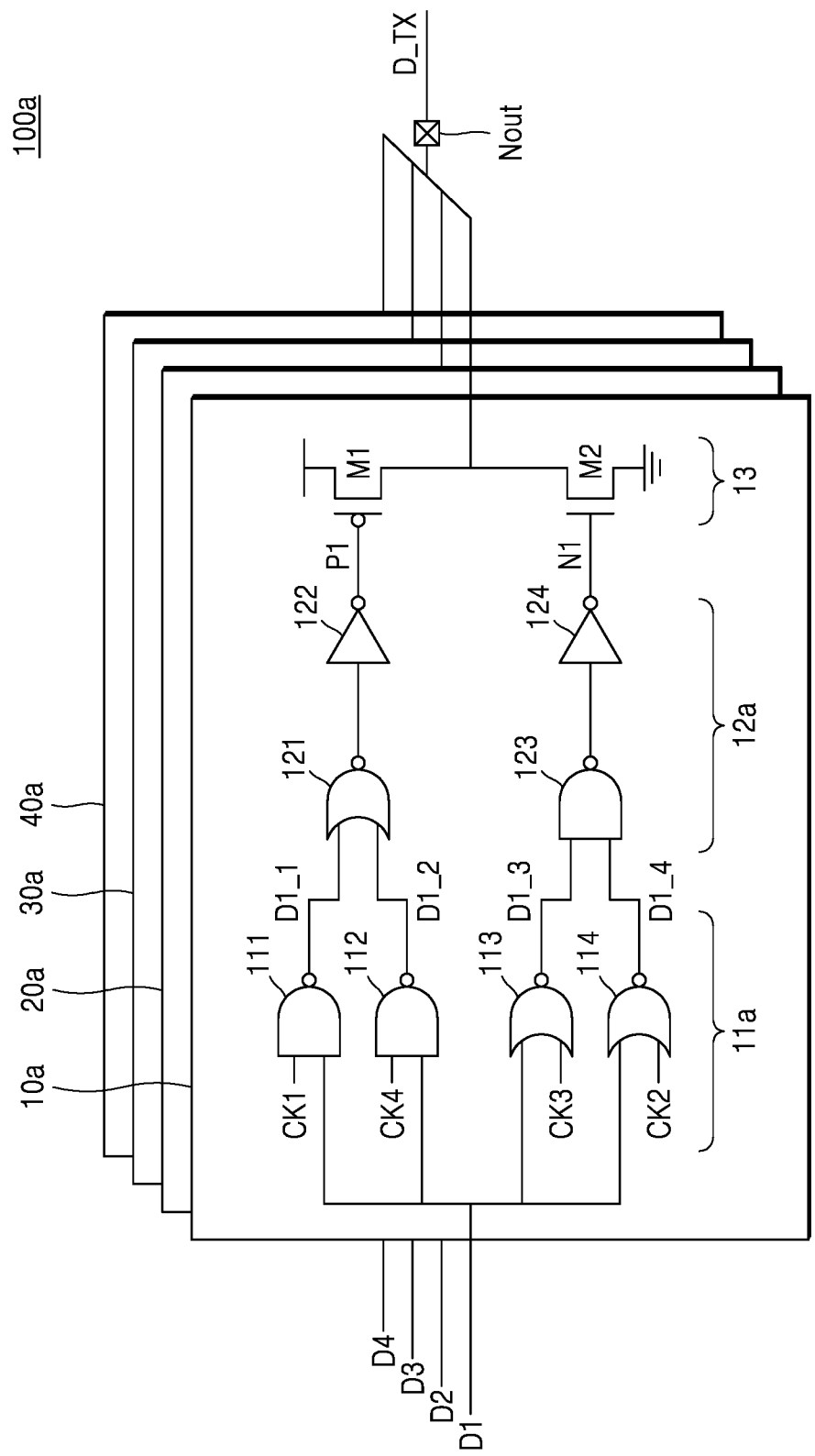
FIG. 4 is a diagram for explaining the structure of a multiplexer according to an example embodiment of the inventive concept.
Figure 5A:
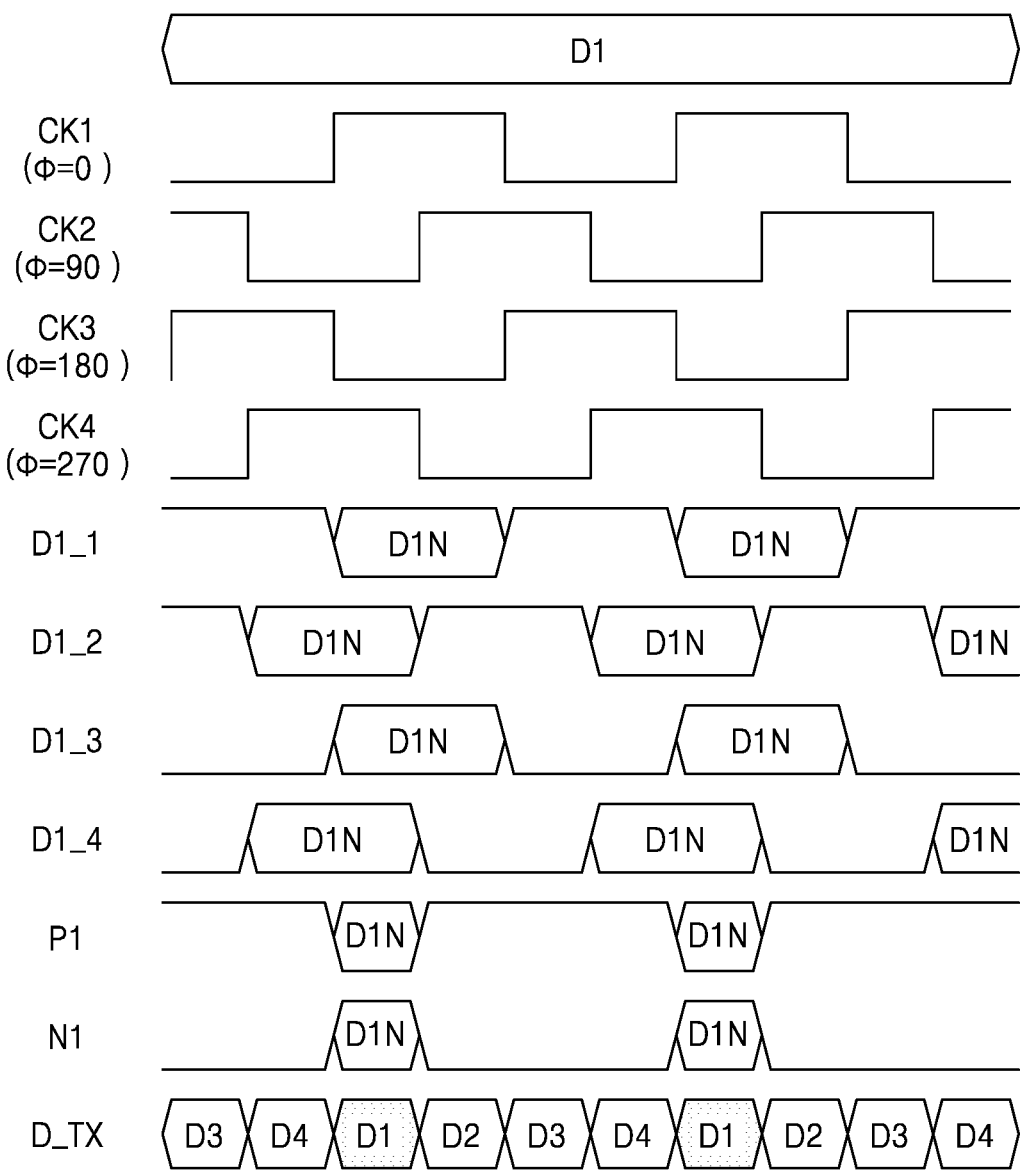
FIGS. 5A to 5C are timing diagrams of the multiplexer of FIG. 4 according to an example embodiment of the inventive concept.
Figure 5B:
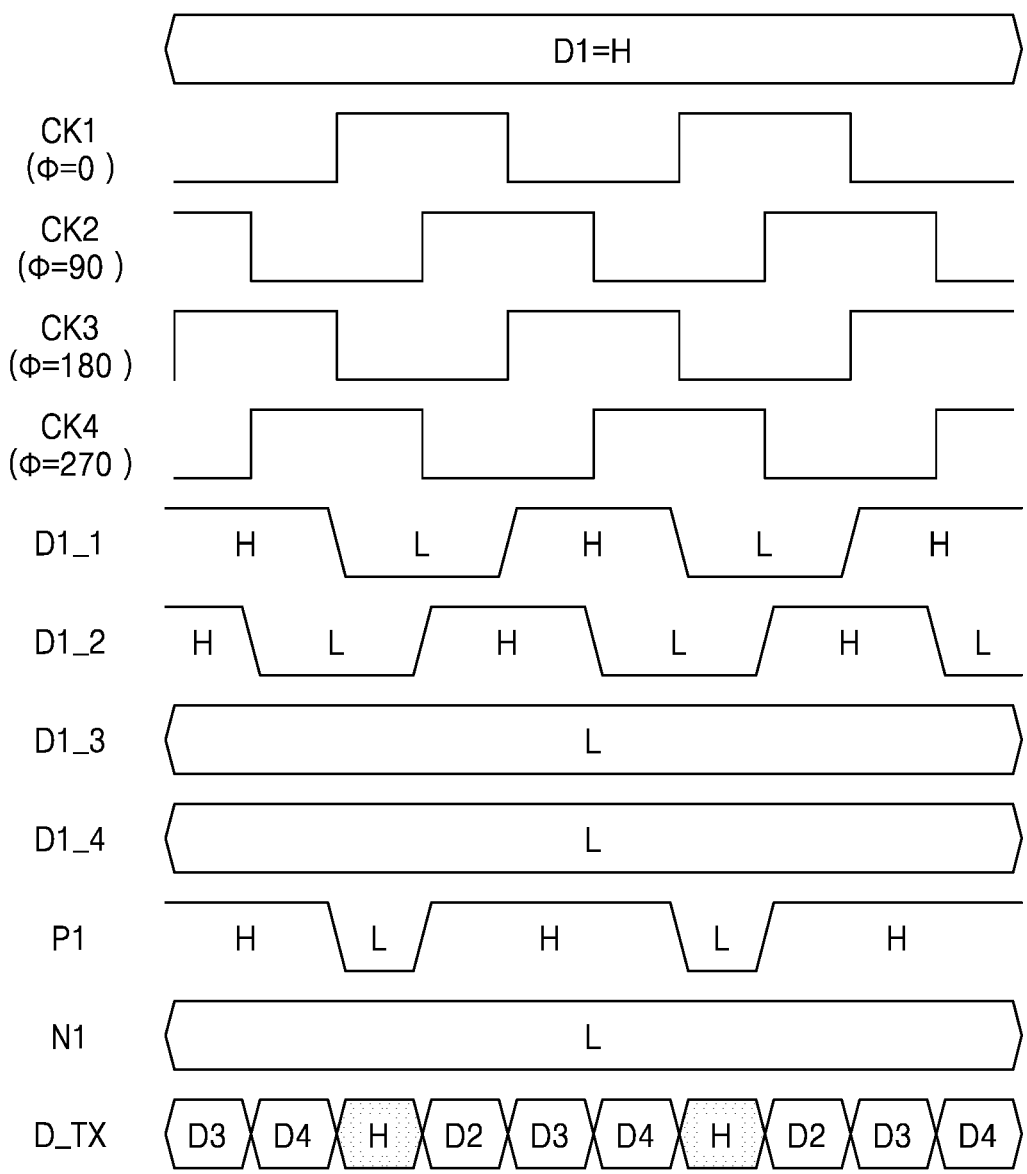
Figure 5C:
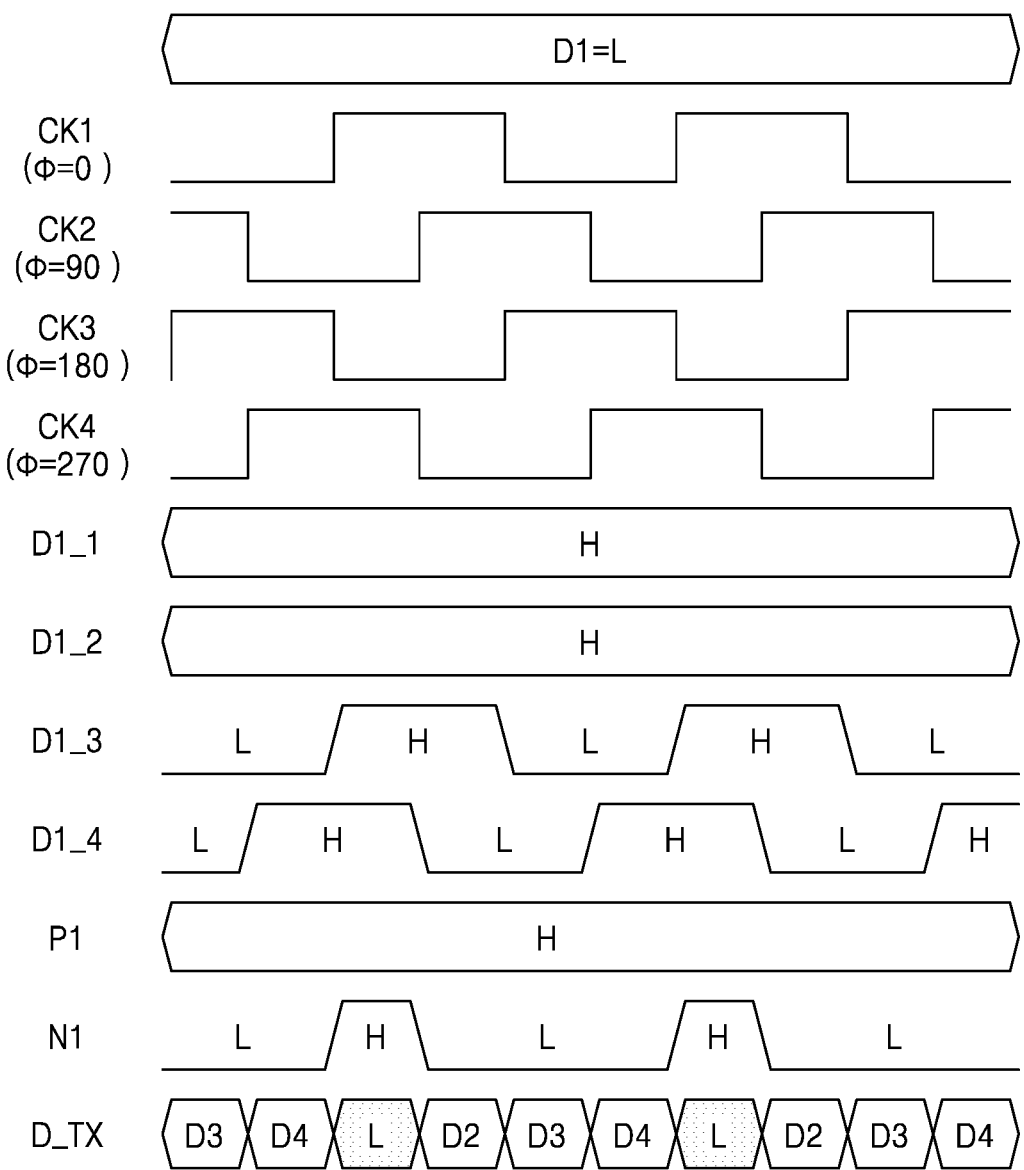

FIG. 4 is a diagram for explaining the structure of a multiplexer according to an example embodiment of the inventive concept. FIGS. 5A to 5C are timing diagrams of the multiplexer of FIG. 4 according to an example embodiment of the inventive concept.

Referring to FIG. 4, a multiplexer 100a may include first to fourth selection circuits 10a, 20a, 30a, and 40a. The number of selection circuits included in the multiplexer 100a is not limited thereto. In the description of FIG. 4, the description of the first selection circuit 10a may also be applied to the second to fourth selection circuits 20a, 30a, and 40a.

The first selection circuit 10a may include a first data multiplexer 11a, a first control signal generator 12a, and a first output driver 13.

The first data multiplexer 11a may include a first NAND circuit 111, a second NAND circuit 112, a first NOR circuit 113, and a second NOR circuit 114.

In the first selection circuit 10a, the first and second NAND circuits 111 and 112 and the first and second NOR circuits 113 and 114 may receive a first parallel data signal D1. Also, in the first selection circuit 10a, the first NAND circuit 111 may generate a first data selection signal D1_1 by performing a NAND operation on a first clock signal CK1 and the first parallel data signal D1. The second NAND circuit 112 may generate a second data selection signal D1_2 by performing a NAND operation on a fourth clock signal CK4 and the first parallel data signal D1. The first NOR circuit 113 may generate a third data selection signal D1_3 by performing a NOR operation on a third clock signal CK3 and the first parallel data signal D1. The second NOR circuit 114 may generate a fourth data selection signal D1_4 by performing a NOR operation on a second clock signal CK2 and the first parallel data signal D1.

In example embodiments, the second, third and fourth selection circuits 20a, 30a and 40a may receive the second, third and fourth parallel data signals D2, D3 and D4, respectively. Each of the second, third and fourth selection circuits 20a, 30a and 40a may include the same circuits as those included in the first selection circuit 10a. Among the circuits included in the second selection circuit 20a, circuits corresponding to the first and second NAND circuits 111 and 112 and the first and second NOR circuits 113 and 114 may receive the second parallel data signal D2, not the first parallel data signal D1. Among the circuits included in the third selection circuit 30a, circuits corresponding to the first and second NAND circuits 111 and 112 and the first and second NOR circuits 113 and 114 may receive the third parallel data signal D3, not the first parallel data signal D1. Among the circuits included in the fourth selection circuit 40a, circuits corresponding to the first and second NAND circuits 111 and 112 and the first and second NOR circuits 113 and 114 may receive the fourth parallel data signal D4, not the first parallel data signal D1.

Referring to FIGS. 4 and 5A, when the first clock signal CK1 has a logic low level, the first data selection signal D1_1 may have a logic high level via the first NAND circuit 111. When the first clock signal CK1 has a logic high level, the first data selection signal D1_1 may have an inverted value D1N of the first parallel data signal D1 via the first NAND circuit 111. When the fourth clock signal CK4 has a logic low level, the second data selection signal D1_2 may have a logic high level via the second NAND circuit 112. When the fourth clock signal CK4 has a logic high level, the second data selection signal D1_2 may have the inverted value D1N of the first parallel data signal D1 via the second NAND circuit 112. When the third clock signal CK3 has a logic high level, the third data selection signal D1_3 may have a logic low level via the first NOR circuit 113. When the third clock signal CK3 has a logic low level, the third data selection signal D1_3 may have the inverted value D1N of the first parallel data signal D1 via the first NOR circuit 113. When the second clock signal CK2 has a logic high level, the fourth data selection signal D1_4 may have a logic low level via the second NOR circuit 114. When the second clock signal CK2 has a logic low level, the fourth data selection signal D1_4 may have the inverted value D1N of the first parallel data signal D1 via the second NOR circuit 114.

The first control signal generator 12a may generate first and second control signals P1 and N1 based on logic operations on the first to fourth data selection signals D1_1 to D1_4.

The first control signal generator 12a may include a third NOR circuit 121, a first inverter 122, a third NAND circuit 123, and a second inverter 124.

The third NOR circuit 121 may perform a NOR operation on the first data selection signal D1_1 and the second data selection signal D1_2. The first inverter 122 may generate the first control signal P1 by inverting an output of the third NOR circuit 121. Referring to FIG. 5A, a first control signal P1 may basically maintain a logic high level, and may have the inverted value D1N of the first parallel data signal D1 in response to an active edge of the first clock signal CK1.

The third NAND circuit 123 may perform a NAND operation on the third data selection signal D1_3 and the fourth data selection signal D1_4. The second inverter 124 may generate the second control signal N1 by inverting an output of the third NAND circuit 123. Referring to FIG. 5A, the second control signal N1 may basically maintain a logic low level, and may have the inverted value D1N of the first parallel data signal D1 in response to the active edge of the first clock signal CK1.

The first output driver 13 may include first and second transistors M1 and M2. The first transistor M1 may be a P-type transistor, and the second transistor M2 may be an N-type transistor. The first control signal P1 may be input to a gate terminal of the first transistor M1, a power voltage node may be connected to a source terminal thereof, and an output node Nout may be connected to a drain terminal thereof. The second control signal N1 may be input to a gate terminal of the second transistor M2, a ground node may be connected to a source terminal thereof, and an output node Nout may be connected to a drain terminal thereof. When the first transistor M1 is turned on, the output node Nout may be precharged, and when the second transistor M2 is turned on, the output node Nout may be discharged.

Referring to FIG. 5A, the default logic level of the first control signal P1 is a logic high level, and when the first parallel data signal D1 has a logic high level, the first control signal P1 may have a logic low level in response to the first clock signal CK1. For example, the first output driver 13 may include the first parallel data signal D1 in the serial data signal D_TX by precharging the output node Nout when the first parallel data signal D1 has a logic high level. In addition, the default logic level of the second control signal N1 is a logic low level, and when the first parallel data signal D1 has a logic low level, the second control signal N1 may have a logic high level in response to the first clock signal CK1. For example, the first output driver 13 may include the first parallel data signal D1 in the serial data signal D_TX by discharging the output node Nout when the first parallel data signal D1 has a logic low level.

FIG. 5B is a diagram for explaining the logic levels of first to fourth data selection signals D1_1 to D1_4 and first and second control signals P1 and N1 when the first parallel data signal D1 has a logic high level.

Referring to FIG. 5B, while the logic level of the first parallel data signal D1 is maintained at the logic high level, the logic levels of the first and second data selection signals D1_1 and D1_2 may be transitioned. On the other hand, the logic levels of the third and fourth data selection signals D1_3 and D1_4 may be maintained at a logic low level. For example, because the third and fourth data selection signals D1_3 and D1_4 do not toggle, power consumed by the third and fourth data signals D1_3 and D1_4 may be reduced.

FIG. 5C is a view for explaining the logic levels of the first to fourth data selection signals D1_1 to D1_4 and the first and second control signals P1 and N1 when the first parallel data signal D1 has a logic low level.

Referring to FIG. 5C, while the logic level of the first parallel data signal D1 is maintained at the logic low level, the logic levels of the third and fourth data selection signals D1_3 and D1_4 may be transitioned. On the other hand, the logic levels of the first and second data selection signals D1_1 and D1_2 may be maintained at a logic high level. For example, because the first and second data selection signals D1_1 and D1_2 do not toggle, power consumed by the first and second data signals D1_1 and D1_2 may be reduced. Accordingly, power consumed by the first selection circuit 10a may be reduced.

Figure 6:
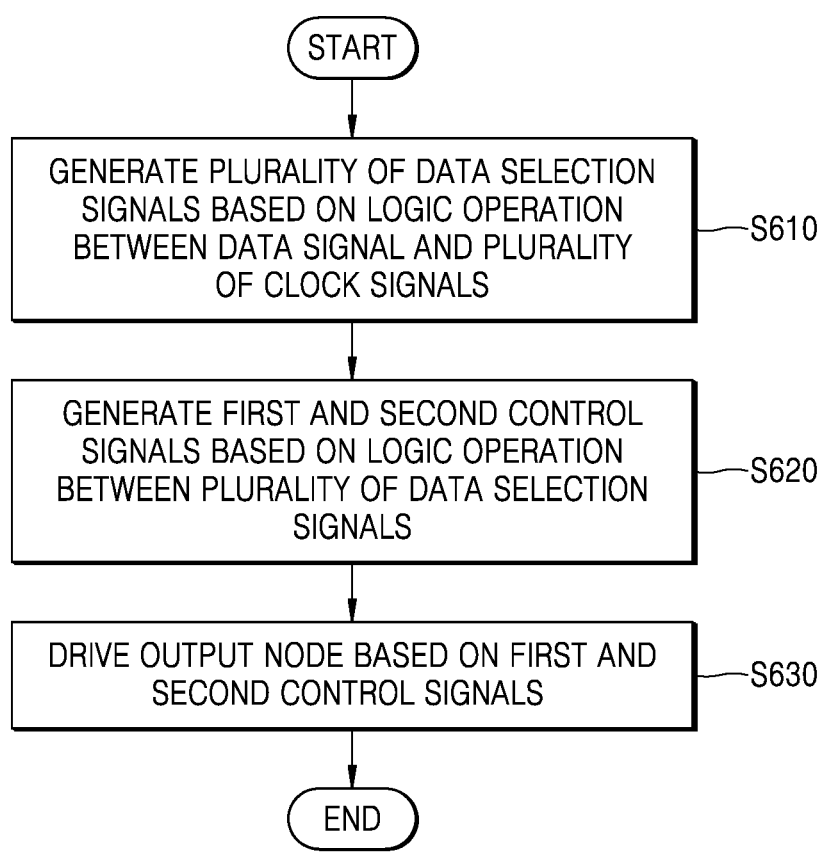
FIG. 6 is a flowchart illustrating a method of operating a selection circuit according to an example embodiment of the inventive concept.

FIG. 6 is a flowchart illustrating a method of operating a selection circuit according to an example embodiment of the inventive concept. The method of operating a selection circuit may include a plurality of operation steps. FIG. 6 may be described with reference to FIG. 4.

In step S610, the first data multiplexer 11a may generate a plurality of data selection signals (e.g., the first to fourth data selection signals D1_1 to D1_4) based on a logic operation between a parallel data signal (e.g., the first parallel data signal D1) and a plurality of clock signals (e.g., the first to fourth clock signals CK1 to CK4). A plurality of logic operations between the parallel data signal and the plurality of clock signals may be performed so that a logic level of some of the plurality of data selection signals is kept constant and a logic level of the other data selection signals is transitioned while the logic level of the parallel data signal is constantly maintained at a specific logic level (e.g., a logic low level or a logic high level).

In step S620, the first control signal generator 12a may generate the first and second control signals P1 and N1 based on a logic operation between the plurality of data selection signals. When the parallel data signal has a logic high level, the first control signal generator 12a may perform a logic operation between the plurality of data selection signals so that the first control signal P1 has a logic low level. When the data signal has a logic low level, the first control signal generator 12a may perform a logic operation on the plurality of data selection signals so that the second control signal N1 has a logic high level.

In step S630, the first output driver 13 may drive the output node Nout based on the first and second control signals P1 and N1. In detail, the first output driver 13 may precharge the output node Nout based on the first control signal P1 having a logic low level, and the output node Nout may be discharged based on the second control signal N1 having a logic high level.

According to the method of operating a selection circuit according to an example embodiment of the inventive concept, because some of the plurality of data selection signals are not toggled while the logic level of the parallel data signal is maintained, power consumption of the selection circuit may be reduced.

Figure 7:
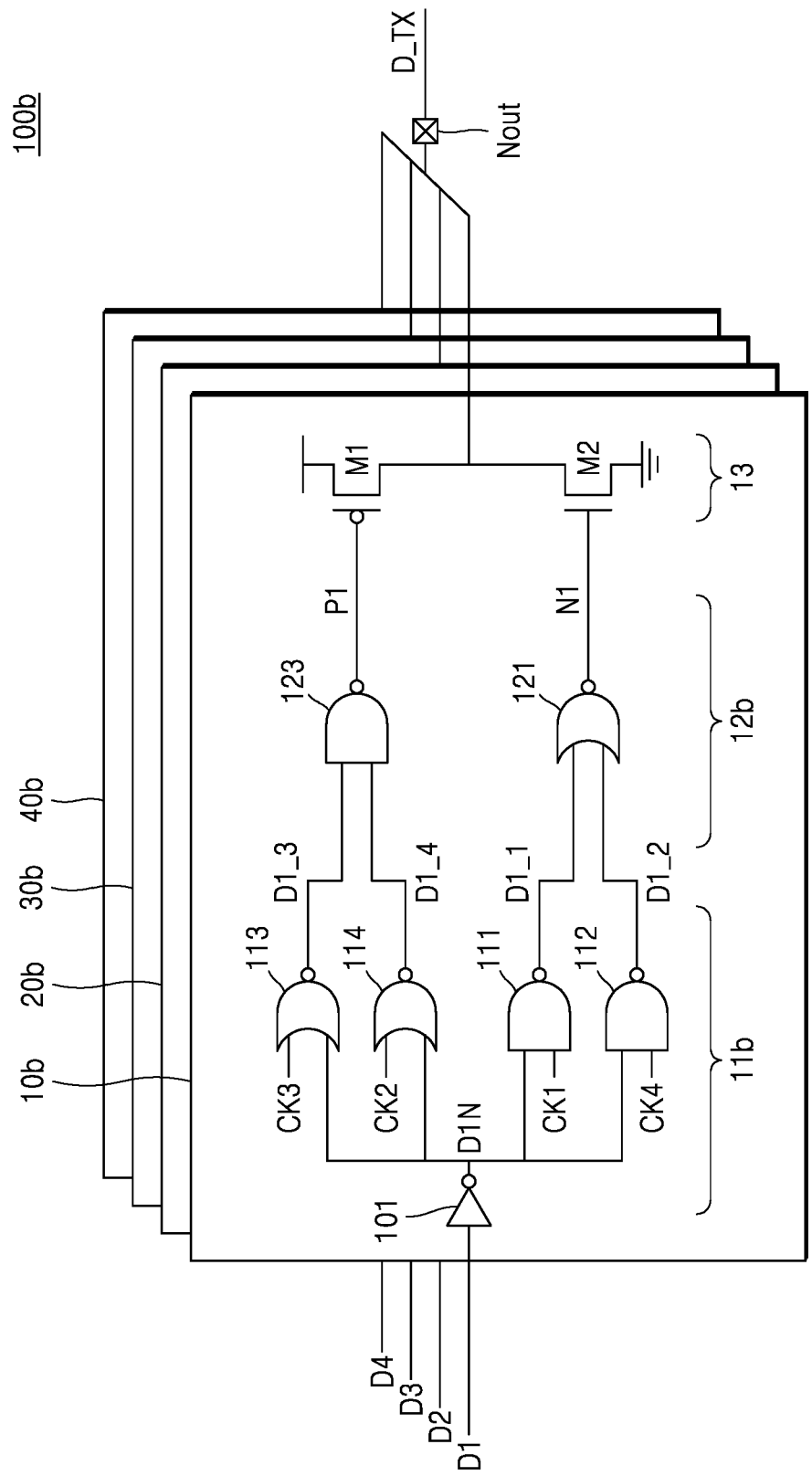
FIG. 7 is a diagram for explaining the structure of a multiplexer according to an example embodiment of the inventive concept.
Figure 8A:
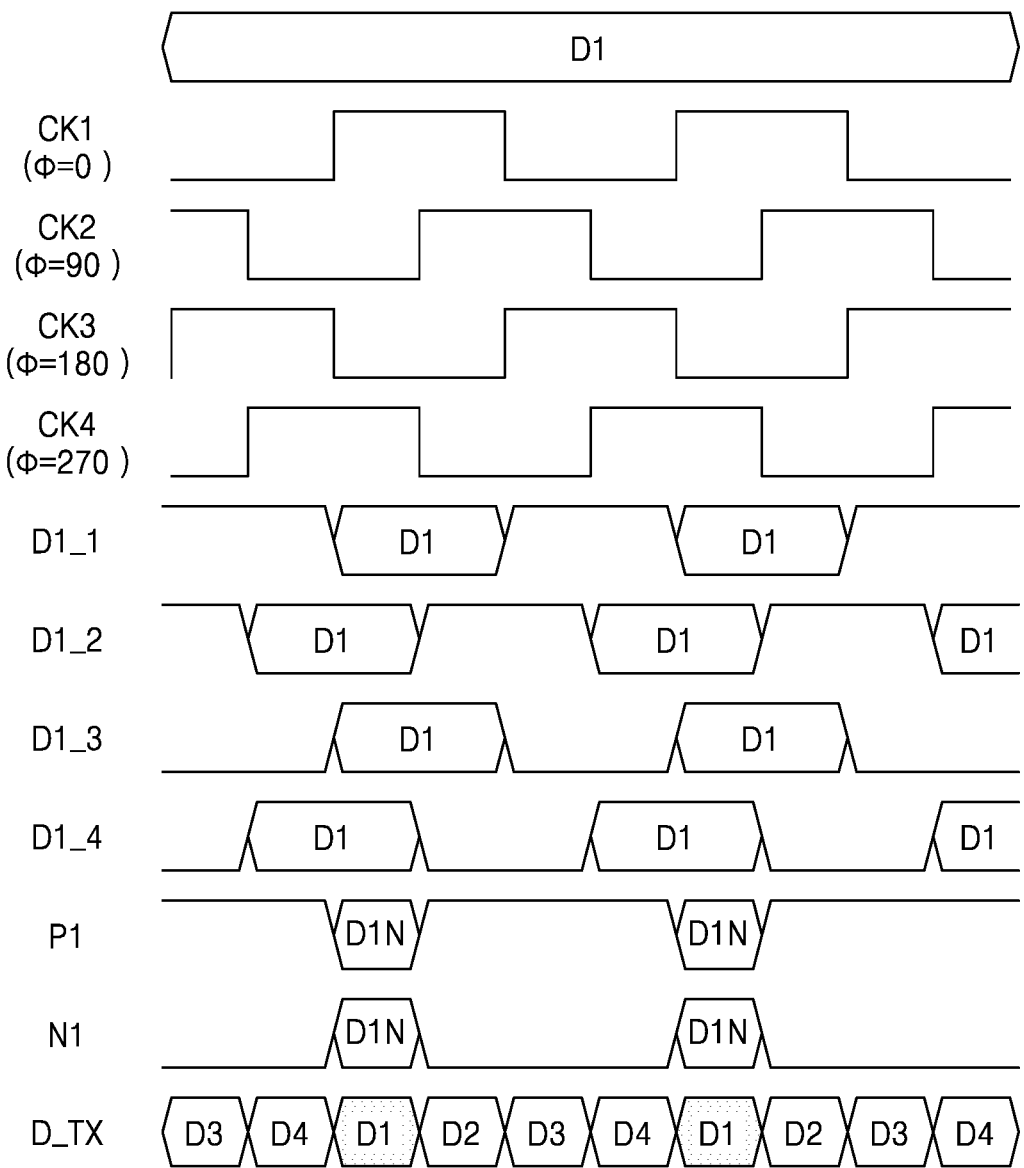
FIGS. 8A to 8C are timing diagrams of the multiplexer of FIG. 7 according to an example embodiment of the inventive concept.
Figure 8B:
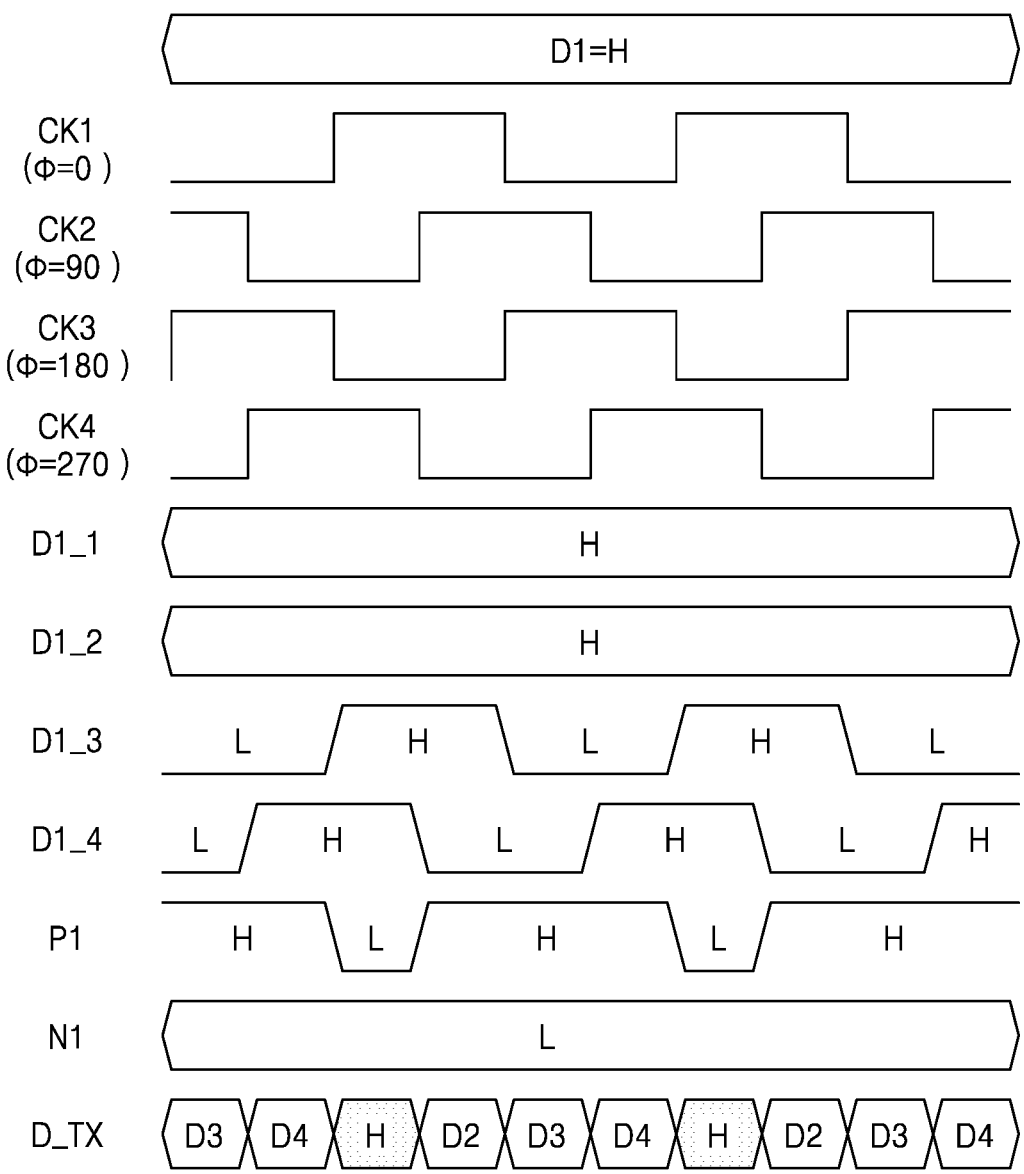
Figure 8C:
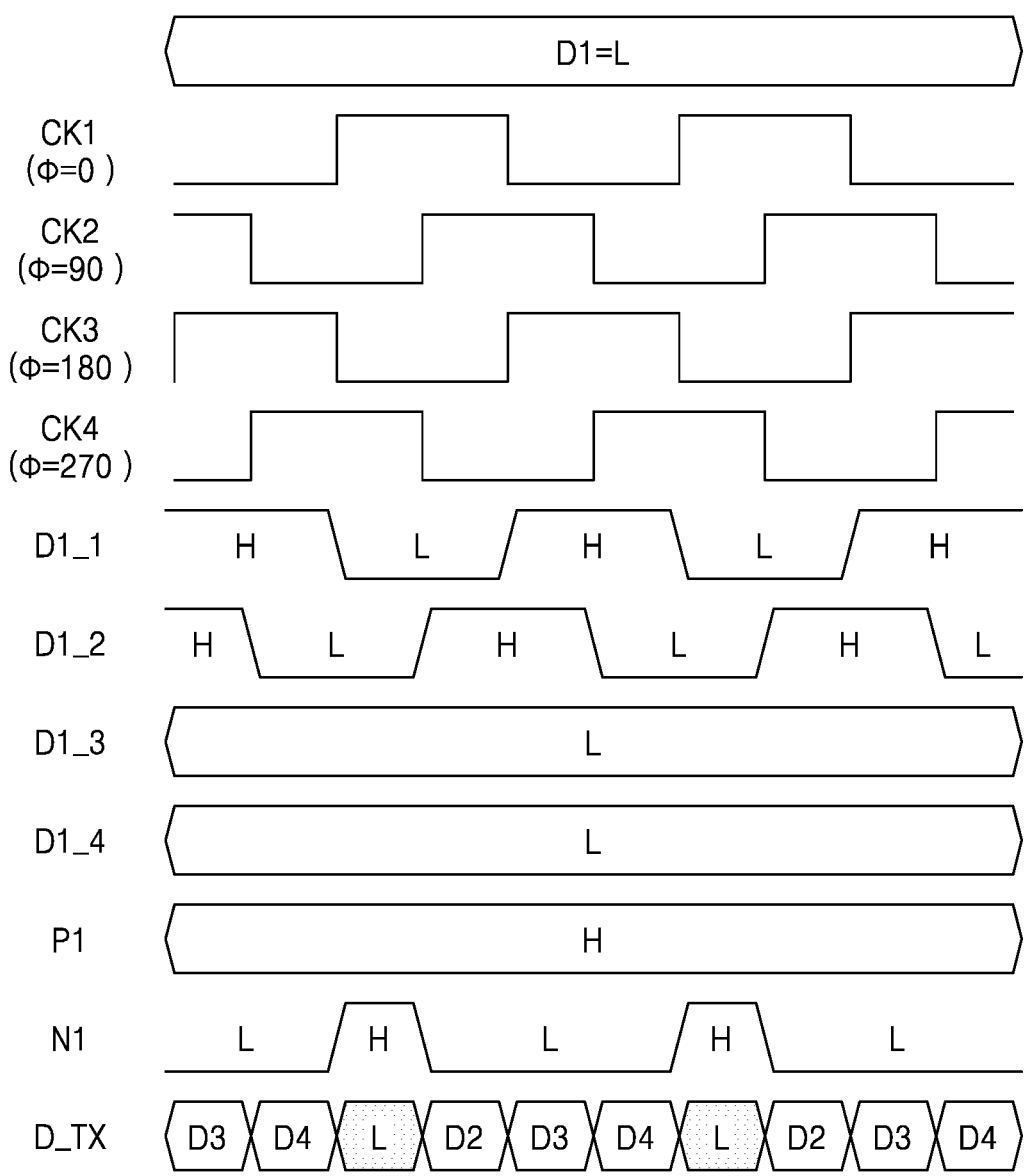

FIG. 7 is a diagram for explaining the structure of a multiplexer according to an example embodiment of the inventive concept. FIGS. 8A to 8C are timing diagrams of the multiplexer of FIG. 7 according to an example embodiment of the inventive concept.

Referring to FIG. 7, a multiplexer 100b may include first to fourth selection circuits 10b, 20b, 30b, and 40b. However, the number of selection circuits included in the multiplexer 100b is not limited thereto. In the description of FIG. 7, the description of the first selection circuit 10b may also be applied to the second to fourth selection circuits 20b, 30b, and 40b.

The first selection circuit 10b may include a first data multiplexer 11b, a first control signal generator 12b, and a first output driver 13. Unlike the first data multiplexer 11a of FIG. 4, the first data multiplexer 11b may include an inverter 101. Unlike the first control signal generator 12a of FIG. 4, the first control signal generator 12b may not include the first and second inverters 122 and 124.

The first data multiplexer 11b may include the inverter 101, a first NAND circuit 111, a second NAND circuit 112, a first NOR circuit 113, and a second NOR circuit 114.

The inverter 101 may receive a first parallel data signal D1 and generate a first inverted data signal (or a first inverted value) D1N of the first parallel data signal D1.

In the first selection circuit 10b, the first NAND circuit 111 may generate a first data selection signal D1_1 by performing a NAND operation on a first clock signal CK1 and the first inverted data signal D1N. The second NAND circuit 112 may generate a second data selection signal D1_2 by performing a NAND operation on a fourth clock signal CK4 and the first inverted data signal D1N. The first NOR circuit 113 may generate a third data selection signal D1_3 by performing a NOR operation on a third clock signal CK3 and the first inverted data signal D1N. The second NOR circuit 114 may generate a fourth data selection signal D1_4 by performing a NOR operation on a second clock signal CK2 and the first inverted data signal D1N.

In example embodiments, the second, third and fourth selection circuits 20b, 30b and 40b may receive the second, third and fourth parallel data signals D2, D3 and D4, respectively. Each of the second, third and fourth selection circuits 20b, 30b and 40b may include the same circuits as those included in the first selection circuit 10b. Among the circuits included in the second selection circuit 20b, a circuit corresponding to the inverter 101 may receive the second parallel data signal D2 not the first parallel data signal D1. Further, the circuit corresponding to the inverter 101 may generate a second inverted data signal (or a second inverted value) D2N of the second parallel data signal D2. Among the circuits included in the third selection circuit 30b, a circuit corresponding to the inverter 101 may receive the third parallel data signal D3 not the first parallel data signal D1. Further, the circuit corresponding to the inverter 101 may generate a third inverted data signal (or a third inverted value) D3N of the third parallel data signal D3. Among the circuits included in the fourth selection circuit 40b, a circuit corresponding to the inverter 101 may receive the fourth parallel data signal D4 not the first parallel data signal D1. Further, the circuit corresponding to the inverter 101 may generate a fourth inverted data signal (or a fourth inverted value) D4N of the fourth parallel data signal D4.

Referring to FIGS. 7 and 8A, when the first clock signal CK1 has a logic low level, the first data selection signal D1_1 may have a logic high level via the first NAND circuit 111. When the first clock signal CK1 has a logic high level, the first data selection signal D1_1 may have a value of the first parallel data signal D1 via the first NAND circuit 111. When the fourth clock signal CK4 has a logic low level, the second data selection signal D1_2 may have a logic high level via the second NAND circuit 112. When the fourth clock signal CK4 has a logic high level, the second data selection signal D1_2 may have the value of the first parallel data signal D1 via the second NAND circuit 112. When the third clock signal CK3 has a logic high level, the third data selection signal D1_3 may have a logic low level via the first NOR circuit 113. When the third clock signal CK3 has a logic low level, the third data selection signal D1_3 may have the value of the first parallel data signal D1 via the first NOR circuit 113. When the second clock signal CK2 has a logic high level, the fourth data selection signal D1_4 may have a logic low level via the second NOR circuit 114. When the second clock signal CK2 has a logic low level, the fourth data selection signal D1_4 may have the value of the first parallel data signal D1 via the second NOR circuit 114.

The first control signal generator 12b may generate first and second control signals P1 and N1 based on logic operations on the first to fourth data selection signals D1_1 to D1_4.

The first control signal generator 12b may include a third NOR circuit 121 and a third NAND circuit 123.

The third NOR circuit 121 may generate the second control signal N1 by performing a NOR operation on the first data selection signal D1_1 and the second data selection signal D1_2. Referring to FIG. 8A, the second control signal N1 may basically maintain a logic low level, and may have the inverted value D1N of the first parallel data signal D1 in response to an active edge of the first clock signal CK1.

third NAND circuit 123 may generate the first control signal P1 by performing a NAND operation on a third data selection signal D1_3 and a fourth data selection signal D1_4. Referring to FIG. 8A, the first control signal P1 may basically maintain a logic high level, and may have the inverted value D1N of the first parallel data signal D1 in response to the active edge of the first clock signal CK1.

Referring to FIG. 8A, the default logic level of the first control signal P1 may be a logic high level, and when the first parallel data signal D1 has a logic high level, the first control signal P1 may have a logic low level in response to the first clock signal CK1. For example, the first output driver 13 may include the first parallel data signal D1 in the serial data signal D_TX by precharging the output node Nout when the first parallel data signal D1 has a logic high level. In addition, the default logic level of the second control signal N1 may be a logic low level, and when the first parallel data signal D1 has a logic low level, the second control signal N1 may have a logic high level in response to the first clock signal CK1. For example, the first output driver 13 may include the first parallel data signal D1 in the serial data signal D_TX by discharging the output node Nout when the first parallel data signal D1 has a logic low level.

FIG. 8B is a diagram for explaining the logic levels of first to fourth data selection signals D1_1 to D1_4 and first and second control signals P1 and N1 when the first parallel data signal D1 has a logic high level.

Referring to FIG. 8B, while the logic level of the first parallel data signal D1 is maintained at the logic high level, the logic levels of the first and second data selection signals D1_1 and D1_2 may be maintained at a logic high level. On the other hand, the logic levels of the third and fourth data selection signals D1_3 and D1_4 may be transitioned. For example, because the first and second data selection signals D1_1 and D1_2 do not toggle, power consumed by the first and second data selection signals D1_1 and D1_2 may be reduced.

FIG. 8C is a view for explaining the logic levels of the first to fourth data selection signals D1_1 to D1_4 and the first and second control signals P1 and N1 when the first parallel data signal D1 has a logic low level.

Referring to FIG. 8C, while the logic level of the first parallel data signal D1 is maintained at the logic low level, the logic levels of the third and fourth data selection signals D1_3 and D1_4 may be maintained at a logic low level. On the other hand, the logic levels of the first and second data selection signals D1_1 and D1_2 may be transitioned. For example, because the third and fourth data selection signals D1_3 and D1_4 do not toggle, power consumed by the third and fourth data selection signals D1_3 and D1_4 may be reduced.

Figure 9:
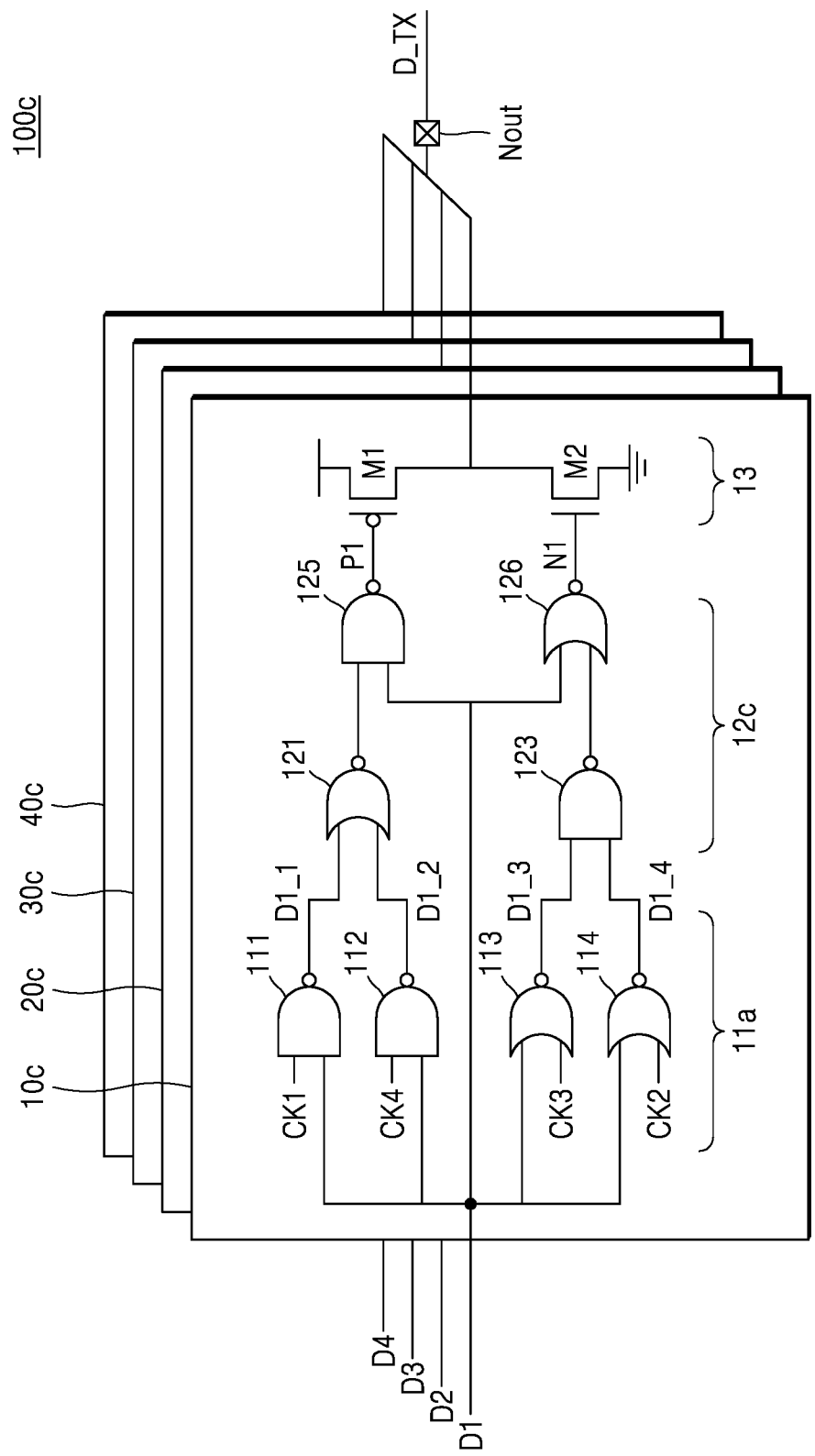
FIG. 9 is a diagram for explaining the structure of a transmitter circuit according to an example embodiment of the inventive concept.

FIG. 9 is a diagram for explaining the structure of a transmitter circuit according to an example embodiment of the inventive concept.

Referring to FIG. 9, a multiplexer 100c may include first to fourth selection circuits 10c, 20c, 30c, and 40c. However, the number of selection circuits included in the multiplexer 100c is not limited thereto. In the description of FIG. 9, the description of the first selection circuit 10c may also be applied to the second to fourth selection circuits 20c, 30c, and 40c.

The first selection circuit 10c may include a first data multiplexer 11a, a first control signal generator 12c, and a first output driver 13. Unlike the first control signal generator 12a of FIG. 4 and the first control signal generator 12b of FIG. 7, the first control signal generator 12c may include a fourth NAND circuit 125 and a fourth NOR circuit 126. Meanwhile, the third NOR circuit 121 may transmit a result of a NOR operation on a first data selection signal D1_1 and a second data selection signal D1_2 to the fourth NAND circuit 125. Also, the third NAND circuit 123 may transmit a result of a NAND operation on a third data selection signal D1_3 and a fourth data selection signal D1_4 to the fourth NOR circuit 126.

In order for a first parallel data signal D1 having a logic low level to be output as a serial data signal D_TX, an output node Nout must be discharged by a second transistor M2, so that a signal level of the output node Nout may become unstable when the first transistor M1 is turned on. When the fourth NAND circuit 125 included in the multiplexer 100c according to an example embodiment of the inventive concept receives the first parallel data signal D1 having a logic low level, the fourth NAND circuit 125 may generate a first control signal P1 having a logic high level. Accordingly, because the first transistor M1 is turned off, the possibility that the output node Nout is precharged may be reduced and signal stability of the output node Nout may be improved.

In order for a first parallel data signal D1 having a logic high level to be output as a serial data signal D_TX, an output node Nout must be precharged by the first transistor M1, so that the signal level of the output node Nout may become unstable when the second transistor M2 is turned on. When the fourth NOR circuit 126 included in the multiplexer 100c according to an example embodiment of the inventive concept receives the first parallel data signal D1 having a logic high level, the fourth NOR circuit 126 may generate a second control signal N1 having a logic low level. Accordingly, because the second transistor M2 is turned off, the possibility that the output node Nout is discharged may be reduced and the signal stability of the output node Nout may be improved.

Figure 10:
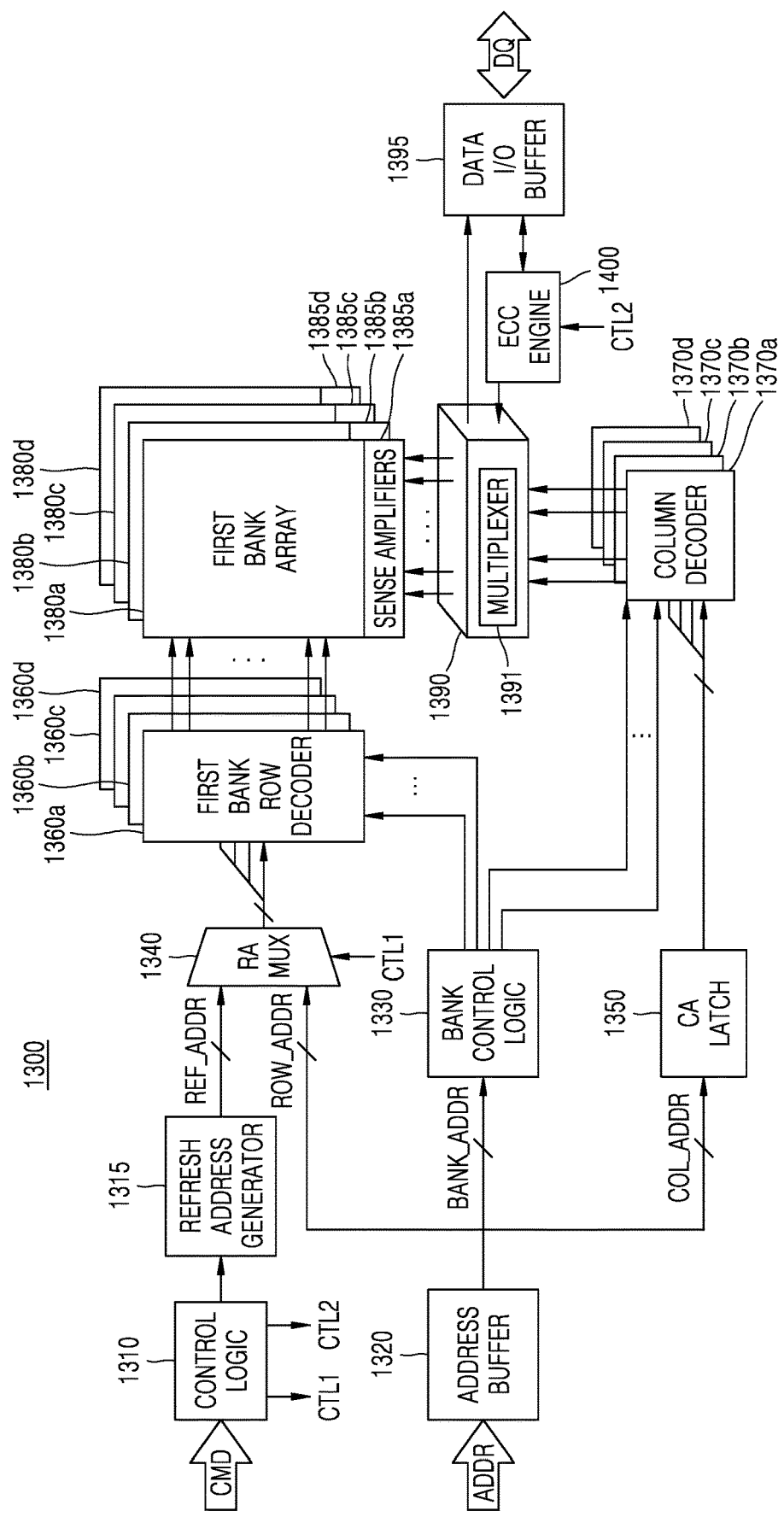
FIG. 10 is a view for explaining a semiconductor memory device including a multiplexer according to an embodiment of the inventive concept.

FIG. 10 is a view for explaining a semiconductor memory device including a multiplexer according to an embodiment of the inventive concept.

Referring to FIG. 10, a semiconductor memory device 1300 may include a control logic 1310, a refresh address generator 1315, an address buffer 1320, a bank control logic 1330, a row address multiplexer 1340, a column address latch 1350, a row decoder, a memory cell array, a sense amplifier unit, a column decoder, an input/output gating circuit 1390, a data input/output buffer 1395, and an ECC engine 1400.

The memory cell array may include first to fourth bank arrays 1380a, 1380b, 1380c, and 1380d. The row decoder may include first to fourth bank row decoders 1360a, 1360b, 1360c, and 1360d respectively connected to the first to fourth bank arrays 1380a, 1380b, 1380c, and 1380d. The column decoder may include first to fourth bank column decoders 1370a, 1370b, 1370c, and 1370d respectively connected to the first to fourth bank arrays 1380a, 1380b, 1380c, and 1380d. The sense amplifier unit may include first to fourth bank sense amplifiers 1385a, 1385b, 1385c, and 1385d respectively connected to the first to fourth bank arrays 1380a, 1380b, 1380c, and 1380d. The first to fourth bank arrays 1380a, 1380b, 1380c, and 1380d, the first to fourth bank row decoders 1360a, 1360b, 1360c, and 1360d, the first to fourth bank column decoders 1370a, 1370b, 1370c, and 1370d, and the first to fourth bank sense amplifiers 1385a, 1385b, 1385c, and 1385d may constitute first to fourth banks, respectively. FIG. 10 shows an example of the semiconductor memory device 1300 including four banks, but according to an embodiment, the semiconductor memory device 1300 may include any number of banks.

In addition, according to an embodiment, the semiconductor memory device 1300 may be dynamic random access memory (DRAM), such as double data rate synchronous dynamic random access memory (DDR SDRAM), low power double data rate (LPDDR) SDRAM, graphics double data rate (GDDR) SDRAM, rambus dynamic random access memory (RDRAM), or may be any volatile memory device requiring a refresh operation.

The control logic 1310 may control the operation of the semiconductor memory device 1300. For example, the control logic 1310 may generate control signals CTL so that the semiconductor memory device 1300 performs a write operation or a read operation. The control logic 1310 may include a command decoder (not shown) for decoding a command CMD received from a memory controller and a mode register (not shown) for setting an operation mode of the semiconductor memory device 1300. For example, the command decoder may generate control signals corresponding to the command CMD by decoding a write enable signal/WE, a row address strobe signal/RAS, a column address strobe signal (/CAS), a chip select signal (/CS), and the like.

The control logic 1310 may further receive a clock signal CLK and a clock enable signal CKE for driving the semiconductor memory device 1300 in a synchronous manner. The control logic 1310 may control the refresh address generator 1315 to perform an auto refresh operation in response to the refresh command or may control the refresh address generator 1315 to perform a self-refresh operation in response to a self-refresh entry command.

The refresh address generator 1315 may generate a refresh address REF_ADDR corresponding to a memory cell row on which a refresh operation is to be performed. The refresh address generator 1315 may generate the refresh address REF_ADDR at a refresh rate longer than the refresh period defined in the standard of the semiconductor memory device 1300. Accordingly, the refresh current and refresh power of the semiconductor memory device 1300 may be reduced.

The address buffer 1320 may receive an address ADDR including a bank address BANK_ADDR, a row address ROW_ADDR, and a column address COL_ADDR from the memory controller. In addition, the address buffer 1320 may provide the received bank address BANK_ADDR to the bank control logic 1330, provide the received row address ROW_ADDR to the row address multiplexer 1340, and provide the received column address COL_ADDR to the column address latch 1350.

The bank control logic 1330 may generate bank control signals in response to the bank address BANK_ADDR. In response to the bank control signals, a bank row decoder corresponding to the bank address BANK_ADDR among the first to fourth bank row decoders 1360a, 1360b, 1360c, and 1360d may be activated, and a bank column decoder corresponding to the bank address BANK_ADDR among the first to fourth bank column decoders 1370a, 1370b, 1370c, and 1370d may be activated.

The bank control logic 1330 may generate bank group control signals in response to a bank address BANK_ADDR determining a bank group. In response to the bank group control signals, row decoders of a bank group corresponding to the bank address BANK_ADDR among the first to fourth bank row decoders 1360a, 1360b, 1360c, and 1360d may be activated, and column decoders of a bank group corresponding to the bank address BANK_ADDR among the first to fourth bank column decoders 1370a, 1370b, 1370c, and 1370d may be activated.

The row address multiplexer 1340 may receive the row address ROW_ADDR from the address buffer 1320 and receive a refresh row address REF_ADDR from the refresh address generator 1315. The row address multiplexer 1340 may selectively output the row address ROW_ADDR or the refresh row address REF_ADDR in response to a first control signal CTL1 generated from the control logic 1310. A row address output from the row address multiplexer 1340 may be applied to the first to fourth bank row decoders 1360a, 1360b, 1360c, and 1360d.

The bank row decoder activated by the bank control logic 1330 among the first to fourth bank row decoders 1360a, 1360b, 1360c, and 1360d may decode the row address output from the row address multiplexer 1340 to activate a word line corresponding to the row address. For example, the activated bank row decoder may apply a word line driving voltage to a word line corresponding to a row address.

The column address latch 1350 may receive the column address COL_ADDR from the address buffer 1320 and temporarily store the received column address COL_ADDR. The column address latch 1350 may gradually increase the received column address COL_ADDR in a burst mode. The column address latch 1350 may apply the temporarily stored or gradually increased column address COL_ADDR to the first to fourth bank column decoders 1370a, 1370b, 1370c, and 1370d, respectively.

The bank column decoder activated by the bank control logic 1330 among the first to fourth bank column decoders 1370a, 1370b, 1370c, and 1370d may activate the sense amplifier corresponding to the bank address BANK_ADDR and the column address COL_ADDR through the input/output gating circuit 1390.

The input/output gating circuit 1390 may include an input data mask logic, read data latches for storing data output from the first to fourth bank arrays 1380a, 1380b, 1380c, and 1380d, and a write driver for writing data to the first to fourth bank arrays 1380a, 1380b, 1380c, and 1380d, together with circuits for gating input/output data.

Data to be read from one of the first to fourth bank arrays 1380a, 1380b, 1380c, and 1380d may be sense-amplified by the sense amplifier and stored in the read data latches. Data DQ stored in the read data latch may be provided to the memory controller through the data input/output buffer 1395. The data DQ to be written in one of the first to fourth bank arrays 1380a, 1380b, 1380c, and 1380d may be provided from the memory controller to the data input/output buffer 1395. The data DQ provided to the data input/output buffer 1395 may be written into one bank array through a write driver.

The input/output gating circuit 1390 may include a multiplexer 1391. The multiplexer 1391 may be one of the multiplexers 100, 100a, 100b, and 100c described above with reference to FIGS. 1, 4, 7, and 9, respectively. The multiplexer 1391 may convert data read in parallel from the first to fourth bank arrays 1380a, 1380b, 1380c, and 1380d into a serial data signal using the method described above with reference to FIGS. 1, 2, 3A, 3B, 4, 5A to 5C, 6, 7, 8A to 8C, and 9. The ECC engine 1400 may be controlled in response to a second control signal CTL2 generated from the control logic 1310.

While the inventive concept has been particularly shown and described with reference to embodiments thereof, it will be understood that various changes in form and details may be made therein without departing from the spirit and scope of the following claims.

What is claimed is:

1. A transmitter circuit comprising:
a clock generator configured to generate a plurality of clock signals having different phases from each other based on a reference clock signal; and
a plurality of selection circuits connected to an output node, and configured to:
receive a plurality of parallel data signals, and
output a serial data signal on the output node based on the plurality of clock signals and the received plurality of parallel data signals,
wherein each of the plurality of selection circuits comprises:
a data multiplexer configured to generate a plurality of data selection signals based on a logic operation between the received one of the plurality of parallel data signals and the plurality of clock signals;
a control signal generator configured to generate first and second control signals based on a logic operation between the plurality of data selection signals; and
an output driver connected to the output node, and configured to:
precharge the output node based on the first control signal, or
discharge the output node based on the second control signal,
wherein the plurality of parallel data signals correspond to a plurality of output drivers including the output driver, respectively, and
wherein the plurality of output drivers are commonly connected to the output node.

2. The transmitter circuit of claim 1, wherein the data multiplexer comprises:
a first NAND circuit configured to perform a NAND operation on the received one of the plurality of parallel data signals and a first clock signal among the plurality of clock signals;

a second NAND circuit configured to perform a NAND operation on the received one of the plurality of parallel data signals and a second clock signal among the plurality of clock signals;

a first NOR circuit configured to perform a NOR operation on the received one of the plurality of parallel data signals and a third clock signal among the plurality of clock signals; and a second NOR circuit configured to perform a NOR operation on the received one of the plurality of parallel data signals and a fourth clock signal among the plurality of clock signals.

3. The transmitter circuit of claim 2, wherein the second clock signal has a phase difference of 270° from the first clock signal, wherein the third clock signal has a 180° phase difference from the first clock signal, and wherein the fourth clock signal has a 90° phase difference from the first clock signal.

4. The transmitter circuit of claim 2, wherein the control signal generator comprises:

a third NOR circuit configured to perform a NOR operation on an output of the first NAND circuit and an output of the second NAND circuit;

a first inverter configured to generate the first control signal by inverting an output of the third NOR circuit;

a third NAND circuit configured to perform a NAND operation on an output of the first NOR circuit and an output of the second NOR circuit; and a second inverter configured to generate the second control signal by inverting an output of the third NAND circuit.

5. The transmitter circuit of claim 4, wherein the output driver comprises:

a P-type transistor configured to receive the first control signal at a gate terminal thereof, and have a source terminal coupled to a power supply voltage node and a drain terminal coupled to the output node; and an N-type transistor configured to receive the second control signal at a gate terminal thereof, and have a source terminal coupled to a ground node and a drain terminal coupled to the output node.

6. The transmitter circuit of claim 2, wherein the control signal generator comprises:

a third NOR circuit configured to perform a NOR operation on an output of the first NAND circuit and an output of the second NAND circuit;

a third NAND circuit configured to perform a NAND operation on an output of the first NOR circuit and an output of the second NOR circuit;

a fourth NAND circuit configured to generate the first control signal by performing a NAND operation on an output of the third NOR circuit and the received one of the plurality of parallel data signals; and a fourth NOR circuit configured to generate the second control signal by performing a NOR operation on an output of the third NAND circuit and the received one of the plurality of parallel data signals.

7. The transmitter circuit of claim 1, wherein the data multiplexer comprises:

an inverter configured to generate an inverted data signal of the received one of the plurality of parallel data A signals;

a first NAND circuit configured to perform a NAND operation on the inverted data signal and a first clock signal among the plurality of clock signals;

a second NAND circuit configured to perform a NAND operation on the inverted data signal and a second clock signal among the plurality of clock signals;

a first NOR circuit configured to perform a NOR operation on the inverted data signal and a third clock signal among the plurality of clock signals; and a second NOR circuit configured to perform a NOR operation on the inverted data signal and a fourth clock signal among the plurality of clock signals.

8. The transmitter circuit of claim 7, wherein the control signal generator comprises:

a third NOR circuit configured to generate the second control signal by performing a NOR operation on an output of the first NAND circuit and an output of the second NAND circuit; and a third NAND circuit configured to generate the first control signal by performing a NAND operation on an output of the first NOR circuit and an output of the second NOR circuit.

9. The transmitter circuit of claim 1, wherein while a logic level of the received one of the plurality of parallel data signals is maintained at a specific logic level:

at least two of the plurality of data selection signals maintain a constant logic level, and the other two or more of the plurality of data selection signals have a logic level transitioned at least once.

10. A selection circuit comprising:

a data multiplexer configured to receive a data signal and to generate a plurality of data selection signals based on a first logic operation between the data signal and a plurality of clock signals;

a control signal generator configured to generate first and second control signals based on a second logic operation between the plurality of data selection signals; and an output driver connected to an output node, and configured to drive the output node by precharging the output node based on the first control signal or discharging the output node based on the second control signal, wherein, regardless of a logic level of the data signal, when the plurality of clock signals are transitioned, a logic level of some of the plurality of data selection signals generated based on the first logic operation is transitioned and a logic level of the other of the plurality of data selection signals generated based on the first logic operation is maintained constant.

11. The selection circuit of claim 10, wherein the data multiplexer comprises:

a first NAND circuit configured to perform a NAND operation on the data signal and a first clock signal among the plurality of clock signals;

a second NAND circuit configured to perform a NAND operation on the signal and a second clock signal among the plurality of clock signals;

a first NOR circuit configured to perform a NOR operation on the data signal and a third clock signal among the plurality of clock signals; and a second NOR circuit configured to perform a NOR operation on the data signal and a fourth clock signal among the plurality of clock signals.

12. The selection circuit of claim 11, wherein the control signal generator comprises:

a third NOR circuit configured to perform a NOR operation on an output of the first NAND circuit and an output of the second NAND circuit;

a third NAND circuit configured to perform a NAND operation on an output of the first NOR circuit and an output of the second NOR circuit;

a fourth NAND circuit configured to generate the first control signal by performing a NAND operation on an output of the third NOR circuit and the data signal; and a fourth NOR circuit configured to generate the second control signal by performing a NOR operation on an output of the third NAND circuit and the data signal.

13. The selection circuit of claim 11, wherein the control signal generator comprises:

a third NOR circuit configured to perform a NOR operation on an output of the first NAND circuit and an output of the second NAND circuit;

a first inverter configured to generate the first control signal by inverting an output of the third NOR circuit;

a third NAND circuit configured to perform a NAND operation on an output of the first NOR circuit and an output of the second NOR circuit; and a second inverter configured to generate the second control signal by inverting an output of the third NAND circuit.

14. The selection circuit of claim 13, wherein the output driver comprises:

a P-type transistor configured to receive the first control signal at a gate terminal thereof, and have a source terminal coupled to a power supply voltage node and a drain terminal coupled to the output node; and an N-type transistor configured to receive the second control signal at a gate terminal thereof, and have a source terminal coupled to a ground node and a drain terminal coupled to the output node.

15. The selection circuit of claim 10, wherein the data multiplexer comprises:

an inverter configured to receive the data signal and generate an inverted data signal of the data signal;

a first NAND circuit configured to perform a NAND operation on the inverted data signal and a first clock signal among the plurality of clock signals;

a second NAND circuit configured to perform a NAND operation on the inverted data signal and a second clock signal among the plurality of clock signals;

a first NOR circuit configured to perform a NOR operation on the inverted data signal and a third clock signal among the plurality of clock signals; and a second NOR circuit configured to perform a NOR operation on the inverted data signal and a fourth clock signal among the plurality of clock signals, and wherein the control signal generator comprises:

a third NOR circuit configured to generate the second control signal by performing a NOR operation on an output of the first NAND circuit and an output of the second NAND circuit; and a third NAND circuit configured to generate the first control signal by performing a NAND operation on an output of the first NOR circuit and an output of the second NOR circuit.

16. A method of operating a selection circuit for selectively outputting a received data signal to an output node, the method comprising:

receiving a data signal;

generating a plurality of data selection signals based on a first logic operation between the signal and a plurality of clock signals;

generating first and second control signals based on a second logic operation between the plurality of data selection signals; and driving the output node by precharging the output node based on the first control signal or discharging the output node based on the second control signal, wherein, regardless of a logic level of the data signal, when the plurality of clock signals are transitioned, the generating of the plurality of data selection signals comprises:

transitioning a logic level of some of the plurality of data selection signals generated based on the first logic operation; and maintaining a logic level of the other of the plurality of data selection signals generated based on the first logic operation constant.

17. The method of claim 16, wherein the generating of the plurality of data selection signals comprises:

performing a first NAND operation on the data signal and a first clock signal among the plurality of clock signals;

performing a second NAND operation on the data signal and a second clock signal among the plurality of clock signals;

performing a first NOR operation on the data signal and a third clock signal among the plurality of clock signals; and performing a second NOR operation on the data signal and a fourth clock signal among the plurality of clock signals.

18. The method of claim 17, wherein the generating of the first and second control signals comprises:

performing a third NOR operation on a result of the first NAND operation and a result of the second NAND operation;

performing a third NAND operation on a result of the first NOR operation and a result of the second NOR operation;

generating the first control signal by performing a fourth NAND operation on a result of the third NOR operation and the data signal; and generating the second control signal by performing a fourth NOR operation on a result of the third NAND operation and the data signal.

19. The method of claim 17, wherein the generating of the first and second control signals comprises:

performing a third NOR operation on a result of the first NAND operation and a result of the second NAND operation;

generating the first control signal by inverting a result of the third NOR operation;

performing a third NAND operation on a result of the first NOR operation and a result of the second NOR operation; and generating the second control signal by inverting a result of the third NAND operation.

20. The method of claim 16, wherein the generating of the plurality of data selection signals comprises:

generating an inverted data signal by inverting the data signal;

performing a first NAND operation on the inverted data signal and a first clock signal among the plurality of clock signals;

performing a second NAND operation on the inverted data signal and a second clock signal among the plurality of clock signals;

performing a first NOR operation on the inverted data signal and a third clock signal among the plurality of clock signals; and performing a second NOR operation on the inverted data signal and a fourth clock signal among the plurality of clock signals, and wherein the generating of the first and second control signals comprises:

generating the second control signal by performing a third NOR operation on a result of the first NAND operation and a result of the second NAND operation; and generating the second control signal by performing a third NAND operation on a result of the first NOR operation and a result of the second NOR operation.

* * * * *